United States Patent [19]
Lee et al.

[11] Patent Number: 5,702,982
[45] Date of Patent: Dec. 30, 1997

[54] METHOD FOR MAKING METAL CONTACTS AND INTERCONNECTIONS CONCURRENTLY ON SEMICONDUCTOR INTEGRATED CIRCUITS

[75] Inventors: Chung-Kuang Lee; Jung-Hsien Hsu; Pin-Nan Tseng, all of Hsin-chu, Taiwan

[73] Assignee: Taiwan Semiconductor Manufacturing Company, Ltd., Hsin-Chu, Taiwan

[21] Appl. No.: 623,438

[22] Filed: Mar. 28, 1996

[51] Int. Cl.⁶ .................................................. H01L 21/44
[52] U.S. Cl. ........................ 437/195; 437/231; 437/228; 437/DIG. 978
[58] Field of Search ........................... 437/195, 231, 437/228, DIG. 978

[56] References Cited

U.S. PATENT DOCUMENTS

| | | | |
|---|---|---|---|
| 5,173,442 | 12/1992 | Carey | 437/194 |
| 5,284,799 | 2/1994 | Sato | 437/189 |
| 5,409,862 | 4/1995 | Wada et al. | 437/194 |

OTHER PUBLICATIONS

K. Ueno et al, "A Half–Micron Pitch Cu Interconnection Technology" 1995 Symposium on VLSI Technology Digest, pp. 27–28.

*Primary Examiner*—Charles L. Bowers, Jr.
*Assistant Examiner*—Lynne A. Gurley
*Attorney, Agent, or Firm*—George O. Saile; Stephen B. Ackerman

[57] ABSTRACT

A method for making metal interconnections and buried metal plug structures for multilevel interconnections on semiconductor integrated circuits was achieved. The method utilizes a single patterned photoresist layer for etching trenches in an insulating layer, while at the same time protecting the device contact areas in the contact openings from being etched, thereby reducing process complexity and manufacturing cost. After the trenches are formed, the patterned photoresist layer and the photoresist in the contact openings is removed by plasma ashing, and a metal layer is deposited and etched back or chem/mech polished to form concurrently the metal interconnections and the buried metal plug contacts. The surface of the metal interconnections is coplanar with the insulating surface, thereby allowing the process to be repeated several times to complete the necessary multilevel of metal wiring needed to wire-up the integrated circuits while maintaining a planar surface.

32 Claims, 3 Drawing Sheets

METHOD FOR MAKING METAL CONTACTS AND INTERCONNECTIONS CONCURRENTLY ON SEMICONDUCTOR INTEGRATED CIRCUITS

BACKGROUND OF THE INVENTION

(1) FIELD OF THE INVENTION

The present invention relates to a method of making metal contacts and multilevel interconnections, and more particularly relates to a method for concurrently forming buried metal plug contacts and metal interconnections for integrated circuits on semiconductor substrates, wherein the metal interconnections are planar with an insulating layer.

(2) DESCRIPTION OF THE PRIOR ART

Ongoing advances in semiconductor processing technologies, such as high-resolution photolithography and anisotropic plasma etching are dramatically reducing the feature sizes of semiconductor devices. This has resulted in increased device packing density on semiconductor substrates leading to Ultra Large Scale Integration (ULSI). For example, device feature sizes are now well below one half micrometer, and the number of devices utilized in making integrated circuits are well over a million, such as on the microprocessor, dynamic random access memory (DRAM), and similar types of chips.

It is common practice in the semiconductor industry to interconnect these semiconductor devices by using multilayers of patterned metal layers to form the integrated circuits. Interposed insulating layers having via holes between the metal layers and contact openings to the semiconducting substrate are used to electrically insulate the various metal levels. The accumulated effect of depositing and patterning the metal layers, one layer over another, results in an irregular or substantially non-planar surface on an otherwise microscopically planar substrate. The rough topography becomes substantially worse as the number of metal levels increases. This downscaling of devices and the formation of the interconnecting metal wiring over the rough topography result in several processing problems. For example, improvement in photolithographic resolution requires a shallow depth of focus (DOF) during photoresist exposure, and results in unwanted distortion of the photoresist images when the photoresist is exposed over the rough topography. Another problem occurs during anisotropic etching to pattern the metal layer. It is difficult to remove the metal over steps in the rough topography because of the directional nature of the anisotropic etch. This can lead to intra-level shorts between metal lines. In addition, thinning of the metal lines over the steps in the rough topography during the metal deposition can lead to yield and reliability problems, and is especially true at high current density where electromigration of the metal atoms can occur, resulting in voids and open lines.

One approach to circumventing these topographic problems is to provide an essentially planar insulating layer on which the metal is deposited and patterned. This planar surface is particularly important at the upper multilayer metal levels where the rough topography can be quite severe. Various methods have been employed to achieve more planar insulating layers. For example, on the semiconductor substrate surface it is common practice to use a chemical vapor deposition (CVD) to deposit a low-melting temperature glass, such as phosphosilicate (PSG) or borophosphosilicate glass (BPSG), and then thermally annealing the glass to form a more planar surface. At the multilayer metal level, where even lower temperature processing is required, biased plasma enhanced CVD (PECVD) or sputter deposition can be used. Another approach is to deposit a CVD oxide and etch-back or use chemical/mechanical polishing (CMP) to planarize the surface, similar to the polishing of silicon wafers. Still other approaches include spin coating on the substrate a spin-on-glass (SOG) layer and then applying etch-back techniques to planarize the layers. It is also now common practice in the semiconductor industry to employ metal plugs in the contact openings and via holes etched in the insulating layer to further improve the planarity and to improve the reliability, as described by J. Sato in U.S. Pat. No. 5,284,799, for making tungsten plugs to the semiconductor substrate. Unfortunately, the improved planar structures require additional processing steps and is less manufacturing cost effective.

A more recent method for forming planar metal/ insulator structures is the Damescene technique, in which recesses or trenches having vertical sidewalls are anisotropically plasma etched in a planar insulating layer, and the insulating layer is then deposited with metal thereby filling the trenches. The metal layer is etched-back or chemical/mechanical polished (CMP) to the insulating layer surface to form metal lines that are imbedded in, and coplanar with the insulating layer surface. The method also incorporates contact openings or via holes which are formed at the same time as the trenches, and then both are simultaneously filled with metal and etched back at the same time to further reduce the number of processing steps. This method for forming 0.35 micrometer (um) wide copper lines with half-micron pitch is described by K. Ueno et al. in a paper published in the 1995 Symposium on VLSI Technology Digest, pages 27–28, entitled "A Half-Micron Pitch Cu Interconnec-tion Technology." However, the method requires an additional etch-stopper layer to form contact holes that are self-aligned to the trenches.

There is still a strong need in the semiconductor industry to further improve upon the planar interconnecting metallurgies while combining processing steps to provide a more cost-effective manufacturing process.

SUMMARY OF THE INVENTION

It is therefore a principal object of the present invention to provide an improved method for forming planar multilevel metal interconnections and concurrently forming metal contact plugs to the substrate and between the metal levels.

It is another object of this invention to provide the above structure by using a single photoresist etch mask to etch the trenches in a planar insulating layer for the metal interconnections, while retaining a portion of the photoresist layer in previously etched contact openings and via holes to protect the device contacts from being attacked during the trench etching.

The method of this invention begins by providing a semiconductor substrate, typically consisting of a lightly doped single crystal silicon substrate. Field oxide (FOX) regions are formed on the substrate surface surrounding and electrically isolating devices areas. Semiconductor devices, such as field effect transistors (FETs) or bipolar transistors having device contact areas are then formed in the device areas. The method for forming, by the same sequence of process steps, the electrical interconnections and the metal plug contacts according to this invention, begins by depositing an insulating layer, such as a chemical vapor deposited (CVD) silicon oxide ($SiO_2$). The insulating layer is made planar by such methods as using a planarizing photoresist layer and etching back in a plasma etcher having a 1:1 etch selectivity between the photoresist and CVD oxide. Alternately, chemical/mechanical polishing (CMP) can be used to planarize the CVD oxide. Using conventional photolithographic techniques and anisotropic plasma etching, contact openings are etched to the device contact areas. After etching the contact openings and removing the contact opening photoresist mask, another photoresist layer is spin-coated on the insulating layer filling the contact openings and forming an essentially planar photoresist layer. The photoresist layer is then patterned to provide an etch mask for anisotropically plasma etching trenches in the insulating layer which extend over the contact openings. By the method of this invention, the planar photoresist layer being thicker in the contact openings is only partially removed during the photoresist development, thereby leaving a portion of the photoresist layer in the contact openings to protect the contact areas when the trenches are etched in the insulating layer. Trenches are then partially etched into the insulating layer, and plasma ashing in oxygen ($O_2$) is used to remove completely the patterned photoresist on the insulating layer and the portion of photoresist remaining in the contact openings. A conformal metal layer which is substantially thicker than half the trench width is deposited to form a metal layer that is essentially planar over the trenches and contact openings. The metal layer is then blanket etched back in a plasma etcher or chemically/mechanically polished (CMP) to the surface of the insulating layer, thereby forming metal interconnections in the trenches. The surface of the metal interconnections is coplanar with the surface of the insulating layer. Metal plugs are concurrently formed in the contact openings from the same metal layer.

Because the interconnection structure above has a planar surface, the method of this invention can be applied a second time to form the next level of interconnections. Another insulating layer is deposited over the interconnection structure, and contact openings, commonly referred to in the semiconductor industry as via holes, are etched in this second insulating layer to contact areas on the underlying patterned metal in the trenches. The process continues as above by photoresist masking and forming trenches in the second insulating layer, while portions of photoresist retained in the contact openings protect the underlying metal from being etched. A second level of interconnections is formed by removing (ashing) the photoresist, depositing a second metal layer, and plasma etching or polishing back to the surface of the second insulating layer, again forming a planar surface. This method can then be repeated several times to form a multilevel interconnection structure required to complete the wiring of the integrated circuit.

BRIEF DESCRIPTION OF THE DRAWINGS

The objects and other advantages of the invention are best understood with reference to the preferred embodiments when read in conjunction with the following drawings.

DESCRIPTION OF THE PREFERRED EMBODIMENTS

The present invention relates to a method for forming electrical interconnections and metal plugs for interconnecting the semiconductor devices, such as field effect transistors (FETs) and bipolar transistors on a semiconductor substrate. The method utilizes a single masking step for forming trenches in an insulating layer for the interconnecting metal wires, and is also used to protect from etching the contact areas in the contact openings which were previously formed. This single masking step reduces the number of process steps and reduces cost. The method also provides a planar surface on which the method can be repeated several times to form multilevel interconnections, thereby further reducing complexity and cost.

Referring now to FIGS. 1 through 7, a detailed embodiment of the invention is described. However, to better appreciate the importance of the invention, and to set the invention in perspective, a brief description of the semiconductor substrate structure on which the interconnections are formed is briefly reviewed.

Figure 1:
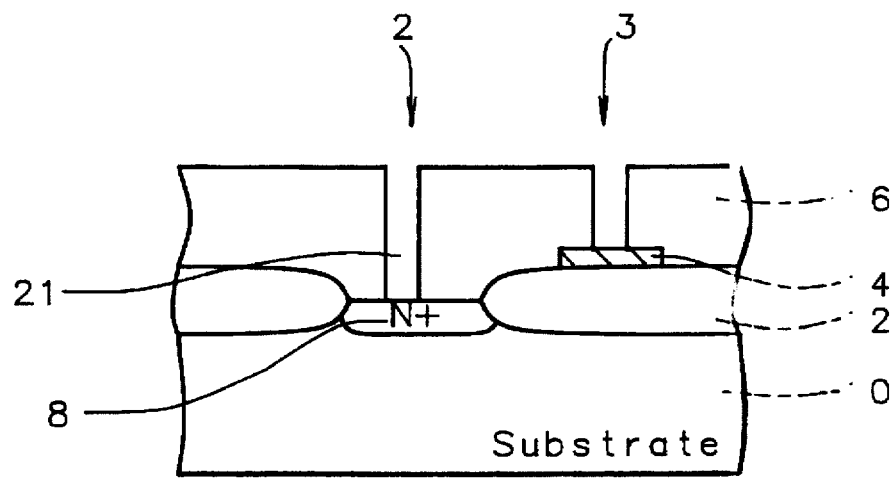
FIGS. 1 through 6 show schematic cross-sectional views for the sequence of process steps for forming a single level of planar electrical interconnections and buried metal plugs on a substrate by the method of this invention.

Starting with FIG. 1, a schematic cross-sectional view is shown of a portion of a semiconductor substrate 10 having partially completed device contact areas and field oxide isolation regions. The most widely used substrate in the semiconductor industry is composed of single crystal silicon having, for example, a <100> crystallographic axial orientation. The silicon is usually conductively doped with N-type dopants, such as arsenic, or P-type dopants, such as boron. Integrated circuits, such as dynamic random access memory (DRAM), static random access memory (SRAM), microprocessors and the like are then built in and on the silicon substrate. However, it should be well understood by those skilled in the art that the method of this invention is equally applicable to other types of substrates where multilevel wiring is required. For the purpose of this invention a silicon substrate is used.

As shown in FIG. 1, field oxide 12 (FOX) regions are formed on the principal surface of the substrate 10 to electrically isolate device areas. The most commonly used field oxide is formed by the method of LOCal Oxidation of Silicon (LOCOS). In this method a silicon nitride layer ($Si_3N_4$) is deposited, for example by chemical vapor deposition (CVD), and patterned by conventional photolithographic techniques and plasma etching to form a $Si_3N_4$ layer over the desired device areas. This silicon nitride layer (not shown in the FIG.) is retained over the desired device areas and is used as a barrier mask to oxidation. The exposed regions of the silicon substrate 10 are then oxidized, for example by steam (wet) oxidation, to form the field oxide 12, as shown in FIG. 1, after removal of the silicon nitride layer. The thickness of the LOCOS-grown oxide 12, which is partially formed above and partially below the surface of the substrate 10, is usually about 4000 to 5500 Angstroms.

Referring still to FIG. 1, semiconductor devices are formed next in and on the substrate surface. However, to simplify the discussion and the drawing, only cross sections through the contact areas for the devices are depicted in FIG. 1. These devices are typically made by forming diffused junctions in the single crystal silicon and incorporating patterned doped polysilicon or polysilicon/silicide (polycide) layers. For example, the N+ doped diffused region 8 can serve as one of a multitude of device contact areas in the substrate, and the patterned polysilicon layers 14 can serve as the gate electrodes for FETs, or for forming bit lines for DRAM and SRAM devices. Layer 14 can also serve as polysilicon emitters and/or bases on bipolar transistors.

Referring now more specifically to this invention, the method for forming the metal interconnections and metal plugs is described. The process starts by depositing an insulating layer 16, commonly referred to as a poly/metal dielectric (PMD) layer, on the device and field oxide areas, as shown in FIG. 1. Preferably the insulating layer 16 is a silicon oxide deposited by low pressure chemical vapor deposition (LPCVD) using, for example, the decomposition of tetraethosiloxane (TEOS). Alternatively, a plasma enhanced chemical vapor deposition (PECVD) using a reactant gas, such as TEOS, can also be used. The insulating layer 16 is then planarized by one of several methods, such as a blanket etch-back using a photoresist planarizing layer and an etch selectivity of 1:1 between the photoresist and LPCVD oxide layer. Alternatively, chemical/mechanical polishing can also be used to planarize the insulating layer. Another approach of forming the planar layer 16 is to deposit a thin barrier layer, such as a LPCVD oxide and then a low-melting temperature oxide, such as a borophosphosilicate glass (BPSG) that is annealed to provide an essentially planar layer. The thickness of layer 16 after planarization is preferably between about 5000 and 10000 Angstroms over the elevated regions on the underlying substrate.

Referring still to FIG. 1, conventional photolithographic techniques and anisotropic plasma etching are used to etch contact openings having essentially vertical sidewalls to the substrate contact areas, such as the contact openings 2 and 3 shown in FIG. 1. For example, the contact openings can be etched in a reactive ion etcher (RIE) using an etch gas mixture containing carbon tetrafluoride ($CF_4$) and hydrogen ($H_2$), or alternatively can be etched in trifluoromethane ($HF_3$) using a carrier gas such as argon (Ar).

Figure 2:
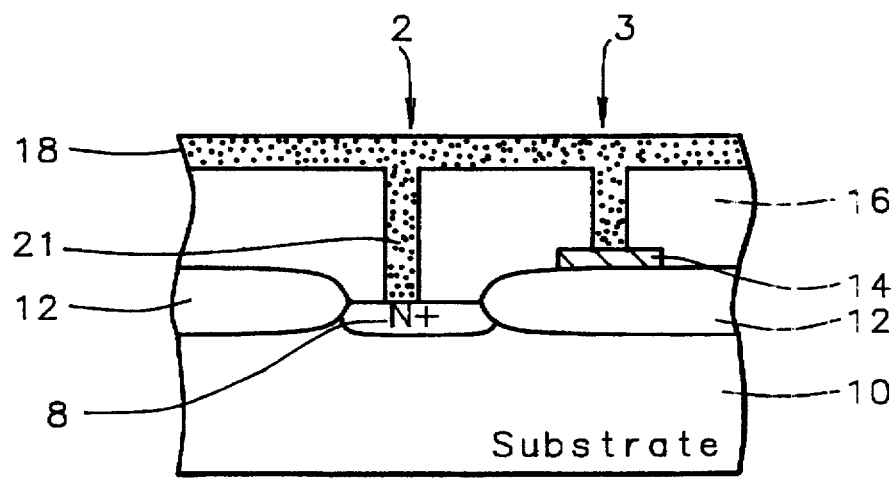

Referring now to FIG. 2, a photoresist layer 18 is deposited, by spin coating, on the insulating layer 16 and in contact openings, such as the contact openings 2 and 3 shown in FIG. 1. The photoresist layer is applied so as to fill the contact openings, and thereby form an essentially planar photoresist layer, as depicted in FIG. 2. The preferred photoresist is a positive photoresist, such as type PFI-38 photoresist manufactured by the Sumitomo Company of Japan. After coating the substrate with photoresist, it is soft-baked (or pre-baked) at a temperature in the range of about 90° to 100° C. for about 30 minutes to drive-off solvents from the photoresist and to improve adhesion. The thickness of the photoresist layer 18 is preferably from about 0.7 to 1.5 micrometers (um) over the planar areas of the insulating layer 16, but, as is obvious from FIG. 2, the photoresist is much thicker in the contact openings, as shown for contact openings 2 and 3. As will soon be seen, the thicker photoresist in the contact openings is utilized by the invention to prevent plasma etching of the device contact areas when trenches are etched in the insulating layer 16 using the patterned photoresist layer 18 as the etch mask.

Figure 3:
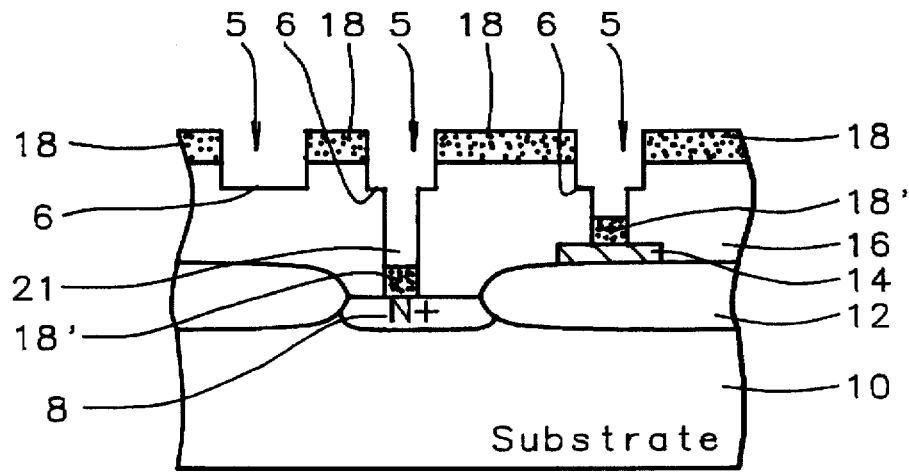

Now as shown in FIG. 3, the photoresist layer 18 is patterned forming open regions 5 in the areas on the underlying insulating layer 16 where trenches are to be etched, and as shown in FIG. 3, the open regions also extend over the contact openings, such as contact openings 2 and 3 (FIG. 1). For example, the trench regions extending over the contact openings provide the means for electrically connecting the metal lines that are later formed in the trenches with metal plugs the are concurrently formed in the contact openings to contact device contacts areas. However, as shown in FIG. 3, and by the method of this invention, the photoresist layer is not developed to completion, but is only partially developed, leaving a portion of the positive photoresist layer 18 in the contact openings, as depicted in FIG. 3 by the portion of photoresist labeled 18'. The photoresist layer 18' is sufficiently thick to protect the source/drain area during the trench etching.

Referring still to FIG. 3, trenches 6 are anisotropically etched in the insulating layer 16 using the patterned photoresist layer 18 as the etch mask, while the portions of photoresist layer 18' in the contact openings protect the device contacts areas 8 and 14 from being etched. The trenches 6 are partially etched into the insulating layer 16, typically to a depth sufficient to provide for the required current density and resistance of the metal line which is formed in the trench. Preferably, the trench is etched to a depth of about 4,000 to 10,000 Angstroms. For an insulating layer 16 composed of silicon oxide, such as a LPCVD $SiO_2$, the trench is preferably anisotropically etched using, for example, a reactive ion etcher (RIE) and an etchant gas such as carbon tetrafluoride ($CF_4$) and hydrogen ($H_2$). Alternatively, the etchant gas can be a trifluoromethane ($CHF_3$). The etch depth can be controlled by using a timed etch, or by using endpoint detection such as optical interference.

Figure 4:
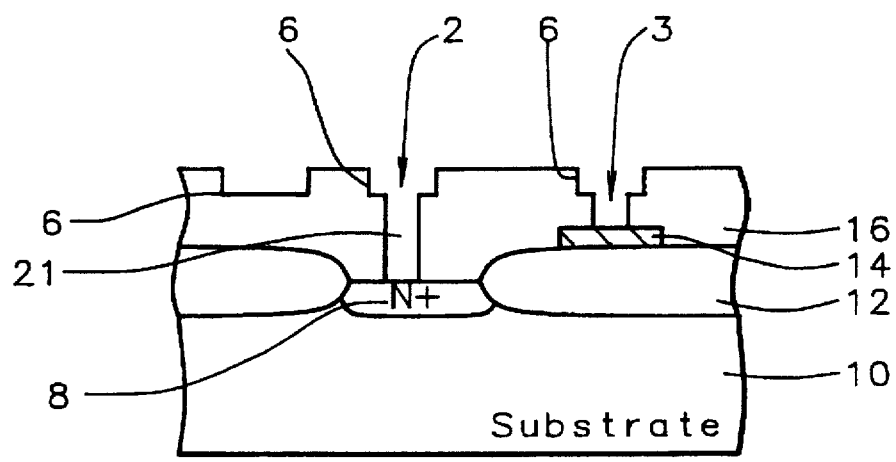

After the trenches 6 are etched in layer 16, the remaining photoresist layer 18 including the photoresist layer 18' in the contact openings 2 and 3, is removed by plasma ashing in oxygen as shown in FIG. 4.

Figure 5:
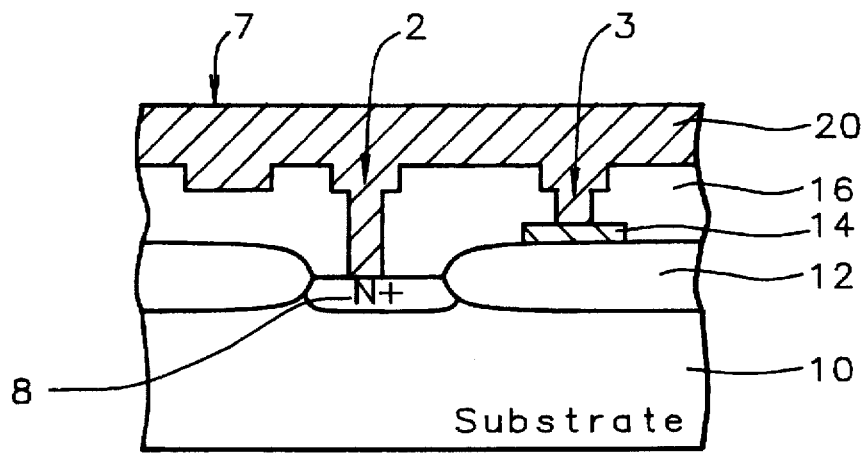
Figure 6:
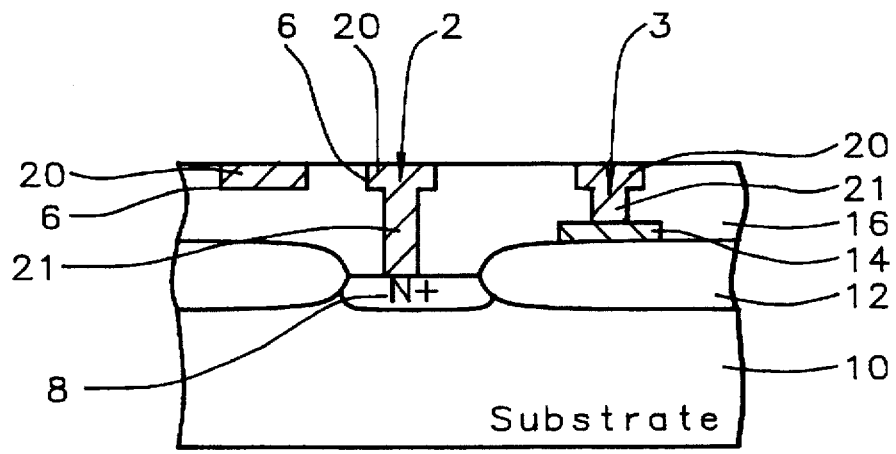

Referring to FIGS. 5 and 6, the method for concurrently forming the metal interconnections and buried metal plugs is now described in which a conformal metal layer is deposited and removed to the surface of the insulating layer 16. The method involves depositing an electrically conducting layer 20, as shown in FIG. 5. Preferably the metal layer 20 is composed of a high conductivity metal such as aluminium (Al) or copper (Cu), to minimize the line resistance in the interconnections and to thereby improve the circuit performance. To prevent aluminium penetration into the shallow device junctions that are formed in the silicon substrate 10, and to prevent copper poisoning of the shallow diffused junctions of the semiconductor devices, it is common practices in the semiconductor industry to include a barrier layer between the device contact areas, such as region 8 in FIG. 5, and the low resistivity metal (Al or Cu). However, to simplify the drawings in FIGS. 5 and 6, the barrier layer is not depicted separately, but is part of layer 20. The most commonly used barrier layers are composed of refractory metals. For example, tungsten (W), titanium (Ti), or a tantalum (Ta)-tungsten (W) alloy are some metals that are used as the barrier layer. Alternatively, a titanium nitride (TiN) layer can also be used which is electrically conducting. Typically the barrier layer is relatively thin, from about 200 to 1000 Angstroms thick. A conformal tungsten layer can be deposited, for example, by CVD using a reactant gas of tungsten hexafluoride ($WF_6$).

After forming the thin barrier layer, a much thicker conformal low resistivity metal, such as aluminum (al) or copper (Cu), is deposited to complete the layer 20. This low resistivity metal simultaneously fills the contact openings (2 and 3 in FIG. 5) to form the buried metal plugs and the trenches 6 to form the metal interconnections. The Al or Cu is deposited to a thickness sufficient to form a planar surface 7, as also shown in FIG. 5. For example, at present-day lithography the trench widths would be about 0.35 um wide, and the thickness of layer 20 including the barrier layer would be at least greater than about 2000 Angstroms (greater than half the trench width), but typically would have a thickness of from about 2000 to 3000 Angstroms. The submicrometer-wide trenches and high aspect ratio contact openings can be filled using more newly developed chemical vapor deposition methods or high pressure extruded Al. For example, a method is described by G. Dixit et al. in a paper entitled "Application of High Pressure Extruded Aluminum to ULSI Metallization" in Semiconductor International, pages 79–86, August 1995.

Now as shown in FIG. 6, the metal layer is removed to the surface of the insulating layer 16, thereby forming the electrically isolated metal lines 20 in the trenches 6, and concurrently forming the metal plug contacts 21 in the contact openings 2 and 3. The preferred method of removing the metal layer to insulating layer 16 is by chemical/mechanical polishing as commonly practiced in the industry, and commonly referred to as the dual Damascene Aluminum process. Alternatively, a plasma etch-back can be used to etch the aluminum layer. For example, a chlorine containing gas, such as boron trichloride ($BCl_3$), carbon tetrachloride ($CCl_4$), silicon tetrachloride ($SiCl_4$), or chlorine ($Cl_2$) can be used. This completes the first level of metal interconnects by the method of this invention, in which a single photoresist layer is used to form the trenches and to simultaneously protect the contact areas from etch attack.

Figure 7:
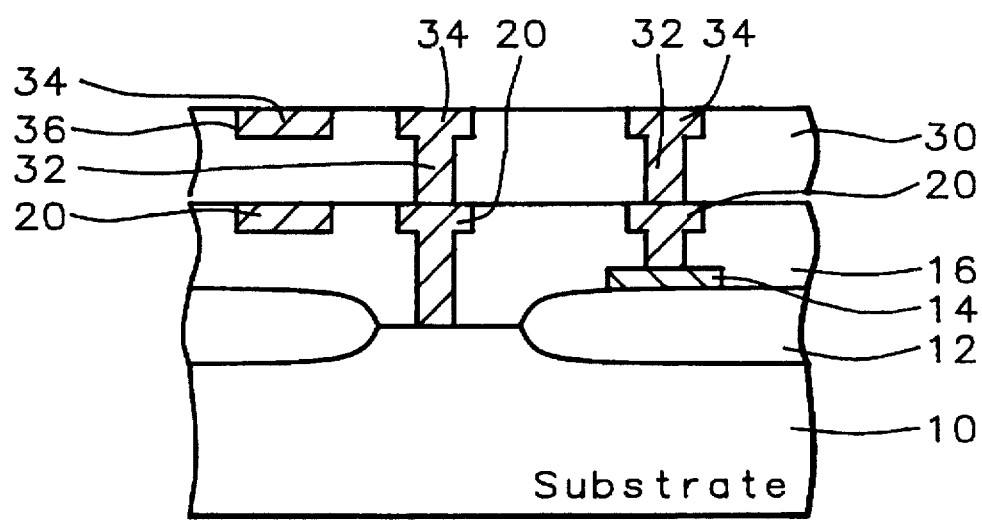
FIG. 7 shows a schematic cross-sectional view of a multilevel interconnection and metal plug structures for two levels of wiring on a semiconductor substrate, by the method of this invention.

Now as shown in FIG. 7, the method of this invention is applied a second time to form a second level of interconnections. The process proceeds by depositing another insulating layer 30, as shown in FIG. 7. Since the first level of metal interconnections is planar (the surfaces of layers 20 and 16 are coplanar, as shown in FIG. 6), layer 30 does not require the planarizing step used to form the first level of interconnections. Layer 30 is typically referred to in the semiconductor industry as the inter-metal-dielectric (IMD) layer. Contact openings 32, also referred to in the industry as via holes, are etched in the insulating layer 30 to the underlying patterned metal layer 20. The previous process using a single photoresist layer, by the method of this invention, is again used to form the trenches 36, and portions of the patterned photoresist layer are retained in the contact openings 32 to protect the contact areas on the metal layer 20 during the trench etching. The remaining portions of the photoresist layer are then removed from the contact openings, such as by plasma ashing. Next, the trenches 36 and contact openings 32 are filled with a high conductivity metal, such as aluminum or copper, as previously described, and are then etched back or chemical/mechanical polished to the surface of the insulating layer 30 to form the second level of interconnections and metal plugs. The process can be repeated several times to fabricate the necessary number of levels to complete the wiring for the integrated circuit. However, after the first interconnection level is formed, the barrier layer metal, which was previously used for substrate contacts, is not required, thereby further simplifying the process.

While the invention has been particularly shown and described with reference to the preferred embodiments thereof, it will be understood by those skilled in the art that various changes in form and details may be made without departing from the spirit and scope of the invention.

What is claimed is:

1. A method for fabricating electrical interconnection and buried metal plug structures, concurrently, on a semiconductor substrate, comprising the steps of:

providing a semiconductor substrate having device areas and field oxide areas, and further having semiconductor devices in said device areas with device contact areas;

depositing a blanket insulating layer composed of an inorganic material on said semiconductor device areas, said insulating layer having a planar surface over said substrate;

masking and anisotropically plasma etching contact openings in said insulating layer to said device contact areas;

coating a photoresist layer on said insulating layer and filling said contact openings, said photoresist layer having a planar surface over said contact openings;

patterning said photoresist layer on said insulating layer and forming a photoresist etch mask for etching trenches in said insulating layer extending over said contact openings, and leaving a portion of said photoresist layer in said contact openings; anisotropically plasma etching said trenches extending partially into said insulating layer, said photoresist in said contact openings protecting said device contact areas from being etched;

plasma ashing and thereby completely removing said patterned photoresist layer and portions of said photoresist in said contact openings;

depositing a conformal metal layer, and filling said trenches and said contact openings in said insulating layer, said metal layer deposited to a thickness that forms a planar surface over said trenches;

blanket removing said metal layer to the surface of said insulating layer, and thereby leaving metal in said trenches and in said contact openings, said metal in said trenches and in said contact openings being coplanar with the surface of said insulating layer, and thereby completing said electrical interconnections and metal plug structures.

2. The method of claim 1, wherein said insulating layer is silicon oxide ($SiO_2$) deposited by chemical vapor deposition (CVD) having a thickness of between about 5000 and 10000 Angstroms.

3. The method of claim 1, wherein the thickness of said photoresist layer, deposited by spin coating, is from about 0.7 to 1.5 micrometers.

4. The method of claim 1, wherein the thickness of said portion of said photoresist layer in said contact openings protects said device contact areas during said anisotropic plasma etching of said trenches.

5. The method of claim 1, wherein said insulating layer is silicon oxide ($SiO_2$) deposited by plasma enhanced chemical vapor deposition (PECVD) having a thickness of between about 5000 and 10000 Angstroms.

6. The method of claim 1, wherein the depth of said trenches in said insulating layer is from about 4000 to 10000 Angstroms.

7. The method of claim 1, wherein the thickness of said conformal metal layer is from about 2000 to 3000 Angstroms.

8. The method of claim 1, wherein said blanket removal of said conformal metal layer is by chemical/mechanical polishing (CMP).

9. The method of claim 1, wherein said blanket removal of said conformal metal layer is by a blanket plasma etch-back.

10. The method of claim 1, wherein said conformal metal layer is composed of aluminum (Al).

11. The method of claim 1, wherein said conformal metal layer is composed of tungsten (W).

12. The method of claim 1, wherein said conformal metal layer is composed of copper (Cu).

13. The method of claim 1, wherein said conformal metal layer is a multilayer comprising a bottom layer composed of the refractory metal barrier layer tungsten (W), and the upper layer is composed of the electrically conducting metal aluminum (Al).

14. A method for fabricating electrical interconnection and buried metal plug structures, concurrently, on a semiconductor substrate, comprising the steps of:

providing a semiconductor substrate having device areas and field oxide areas, and further having semiconductor devices in said device areas with device contact areas;

depositing a blanket insulating layer composed of an inorganic material on said semiconductor device areas, said insulating layer composed of silicon oxide and having a planar surface over said substrate;

masking and anisotropically plasma etching contact openings in said insulating layer to said device contact areas;

coating a photoresist layer on said insulating layer and filling said contact openings, said photoresist layer having a planar surface over said contact openings;

patterning said photoresist layer on said insulating layer and forming a photoresist etch mask for etching trenches in said insulating layer extending over said contact openings, and leaving a portion of said photoresist layer in said contact openings;

anisotropically plasma etching said trenches extending partially into said insulating layer, said photoresist layer in said contact openings protecting said device contact areas from being etched;

plasma ashing and thereby completely removing said patterned photoresist layer and portions of said photoresist in said contact openings;

depositing a conformal metal layer, and filling said trenches and said contact openings in said insulating layer, said conformal metal layer deposited to a thickness that forms a planar surface over said trenches;

plasma etching back said conformal metal layer to the surface of said insulating layer, and thereby leaving metal in said trenches and in said contact openings, said metal in said trenches and in said contact openings being coplanar with the surface of said insulating layer, and thereby completing said electrical interconnection and buried metal plug structures.

15. The method of claim 14, wherein the thickness of said insulating layer is between about 5000 and 10000 Angstroms.

16. The method of claim 14, wherein the thickness of said photoresist layer, deposited by spin coating, is from about 0.7 to 1.5 micrometers.

17. The method of claim 14, wherein the thickness of said portion of said photoresist layer in said contact openings protects said device contact areas during said anisotropic plasma etching of said trenches.

18. The method of claim 14, wherein said insulating layer is silicon oxide ($SiO_2$) deposited by plasma enhanced chemical vapor deposition (PECVD).

19. The method of claim 14, wherein the depth of said trenches in said insulating layer is between about 4000 and 10000 Angstroms.

20. The method of claim 14 wherein the thickness of said conformal metal layer is from about 2000 to 3000 Angstroms.

21. The method of claim 14 wherein said conformal metal layer is composed of aluminum (Al).

22. The method of claim 14, wherein said conformal metal layer is composed of tungsten (W).

23. The method of claim 14, wherein said conformal metal layer is composed of copper (Cu).

24. The method of claim 14, wherein said conformal metal layer is a multilayer comprising a bottom layer composed of the refractory metal barrier layer tungsten (W), and the upper layer is composed of the electrically conducting metal aluminium (Al).

25. A method for fabricating multilevel electrical interconnections and buried metal plug structures for integrated circuits on a semiconductor substrate, comprising the steps of:

(a) providing a semiconductor substrate having device areas and field oxide areas, and further having semiconductor devices in said device areas;

(b) depositing a blanket insulating layer composed of an inorganic material on said semiconductor device areas, said insulating layer having a planar surface over said substrate;

(c) masking and anisotropically plasma etching contact openings in said insulating layer to contact areas on said substrate;

(d) coating a photoresist layer on said insulating layer and filling said contact openings, said photoresist layer having a planar surface over said contact openings;

(e) patterning said photoresist layer on said insulating layer and forming a photoresist etch mask for etching trenches in said insulating layer extending over said contact openings, and leaving a portion of said photoresist layer in said contact openings;

(f) anisotropically plasma etching said trenches extending partially into said insulating layer, said photoresist left in said contact openings protecting said contact areas from being etched;

(g) plasma ashing, and thereby completely removing said patterned photoresist layer and portions of said photoresist in said contact openings;

(h) depositing a conformal metal layer, and filling said trenches and said contact openings in said insulating layer, said metal layer having a planar surface;

(i) blanket removing said metal layer to the surface of said insulating layer, and thereby leaving metal in said trenches and in said contact openings, said metal in said trenches and in said contact openings being coplanar with the surface of said insulating layer, and thereby completing said electrical interconnections and buried metal plug structures; and further, forming additional levels of electrical interconnections and buried metal plugs by;

(j) depositing another insulating layer composed of an inorganic material;

(k) etching contact openings in said other insulating layer to said patterned metal layer in said trenches in said insulating layer;

(l) repeating steps (d) through (i) and thereby forming another level of electrical interconnections and buried metal plug structures;

(m) repeating steps (j) through (l) for each additional level of interconnections required to complete said multilevel electrical interconnections and buried metal plug structures for said integrated circuits.

26. The method of claim 25, wherein the thickness of said insulating layers and the depth of said trenches are determined by circuit performance requirements.

27. The method of claim 25, wherein the thickness of said portions of photoresist in said contact openings prevents etching said contact areas during said trench etching.

28. The method of claim 25, wherein said blanket removal of said conformal metal layer is by chemical/mechanical polishing (CMP).

29. The method of claim 25, wherein said blanket removal of said conformal metal layer is by a blanket plasma etch-back.

30. The method of claim 25, wherein said conformal metal layer is composed of aluminum (Al).

31. The method of claim 25, wherein said conformal metal layer is composed of copper (Cu).

32. The method of claim 25, wherein said conformal metal layer is a multilayer comprising a bottom layer composed of the refractory metal barrier layer tungsten (W), and the upper layer is composed of the electrically conducting metal aluminum (Al).

* * * * *